United States Patent [19]
Coleman, Jr.

[11] Patent Number: 5,608,399
[45] Date of Patent: Mar. 4, 1997

[54] RESOLUTION ENHANCER CIRCUIT FOR ANALOG TO DIGITAL CONVERTERS

[75] Inventor: Edward P. Coleman, Jr., Fairport, N.Y.

[73] Assignee: PSC Inc., Webster, N.Y.

[21] Appl. No.: 510,093

[22] Filed: Aug. 1, 1995

[51] Int. Cl.$^6$ .................................................. H03M 1/18
[52] U.S. Cl. ........................... 341/139; 341/155; 341/131
[58] Field of Search ..................................... 341/139, 155, 341/156, 158, 131

[56] References Cited

U.S. PATENT DOCUMENTS

| | | | |
|---|---|---|---|
| 3,187,323 | 6/1965 | Flood et al. | 340/347 |
| 3,753,133 | 8/1973 | Shumate, Jr. | 328/151 |
| 3,790,947 | 2/1974 | Campbell et al. | 340/347 |
| 4,517,550 | 5/1985 | Nakamura et al. | 340/347 |
| 4,562,456 | 12/1985 | Bolger | 358/13 |
| 4,605,920 | 8/1986 | Naisuler | 341/166 |
| 4,774,499 | 9/1988 | Mapleston | 341/158 |
| 4,851,842 | 7/1989 | Iwamatsu | 341/139 |
| 4,901,078 | 2/1990 | Goyal | 341/163 |
| 5,194,865 | 3/1993 | Mason et al. | 341/132 |
| 5,296,856 | 3/1994 | Mantong | 341/139 |

*Primary Examiner*—Brian K. Young
*Attorney, Agent, or Firm*—Joseph F. Murphy

[57] ABSTRACT

A resolution enhancer circuit provides an increased resolution capability for an A/D converter. The resolution enhancer circuit receives as input an analog input signal having a range greater than the effective range of the A/D, and prescales the input signal to a range that is within the common mode range of op amps used within the resolution enhancer circuit. The input signal can also have a range much less than the effective range of the A/D, and then it would be increased by the prescaler to be within an operable range of the A/D. The prescaled signal is provided to a sampling circuit, which samples the prescaled signal at times determined to be near-saturation conditions of the A/D. A magnified difference between the prescaled signal and the sampled signal, biased to the sampled signal, is then input to the A/D, which determines a number of A/D counts based on that value. As the input signal varies, the number of A/D counts may approach either a high or low saturation condition, which causes a resampling of the prescaled signal. This resampling of the prescaled signal effectively moves the approximate center of a high resolution window to a current value of the analog input signal, and allows for an n-bit A/D to provide increased resolution for a wide ranging analog input signal.

18 Claims, 4 Drawing Sheets

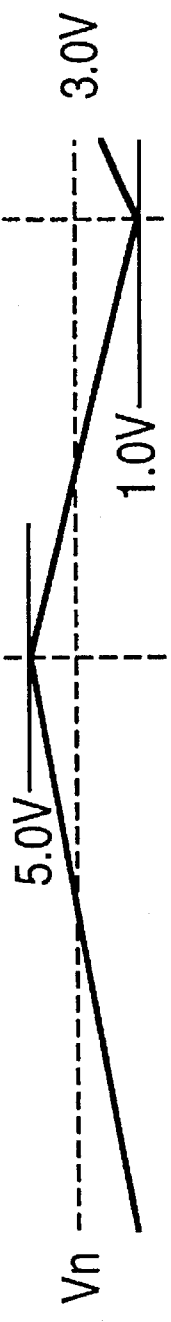
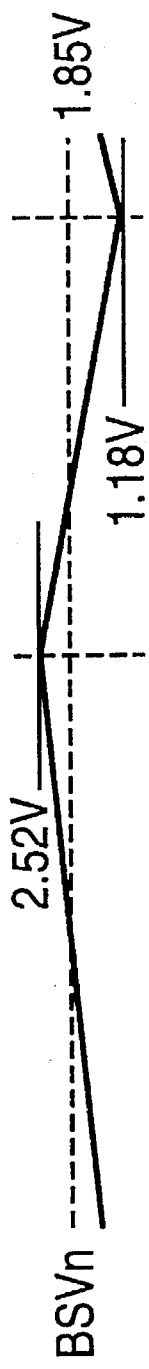
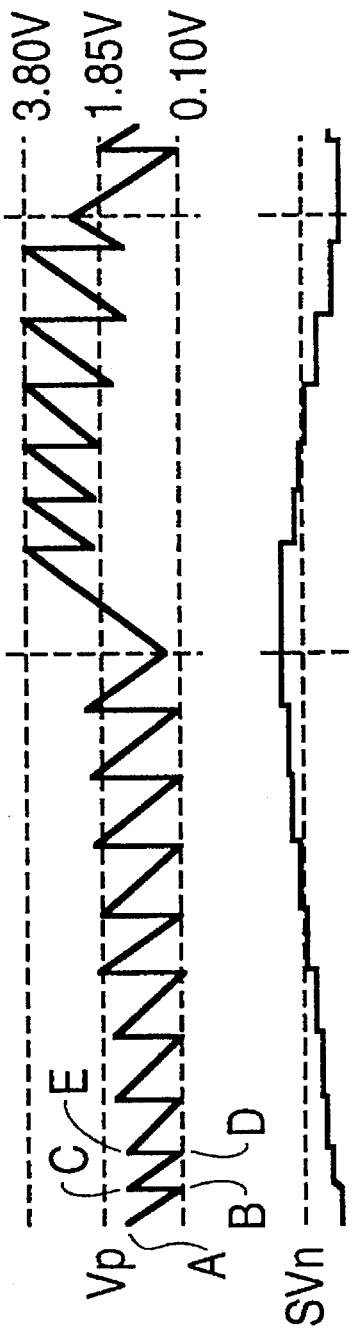
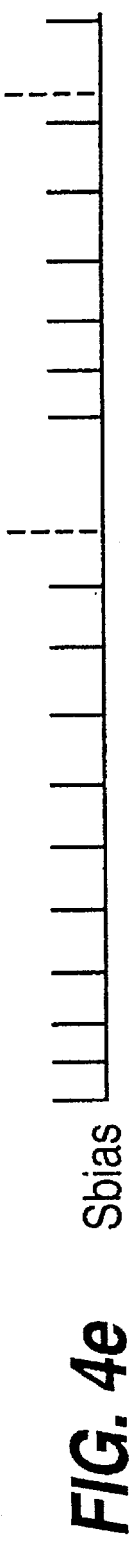
FIG. 4a
FIG. 4b
FIG. 4c
FIG. 4d
FIG. 4e

RESOLUTION ENHANCER CIRCUIT FOR ANALOG TO DIGITAL CONVERTERS

BACKGROUND OF THE INVENTION

1. Field of the Invention

The invention relates to a resolution enhancer circuit for providing increased resolution for an analog to digital (A/D) converter. More specifically, the invention relates to a signal processing system which performs a "windowing" function to position the current value of a large-range input voltage to a value that can be digitized within the operating range of the A/D converter.

2. Description of the Related Art

When designing a signal processing system which includes an A/D converter, the A/D converter must be selected to provide adequate resolution for all signals processed by the system. That is, the A/D converter must operate over the entire voltage range of an input signal, leading to the use of costly high resolution A/D converters to meet design requirements.

For example, in systems which use an 8-bit microcontroller with an 8-bit A/D converter integrated into the microcontroller, the microcontroller may have to be replaced by an external 12, 16 or 32 bit A/D converter to meet performance requirements. The result is increased cost, circuit area, power consumption and decreased circuit reliability.

U.S. Pat. No. 4,901,078, issued to Goyal, discusses a "window detector" used with a recirculating A/D converter. In the Goyal device, an input signal is sent through the A/D twice in order to obtain a high resolution digital output. U.S. Pat. No. 5,296,856, issued to Mantong, discusses another type of "window detector" A/D converter, in which the time between two successive out-of-limit signals is used to compute a high resolution digital output.

With these conventional devices, there must either be performed multiple runs of the same analog input value, or there is needed a timing mechanism to determine the digital signal based on two successive out-of-limit signals, leading to high complexity and increased cost.

Therefore, it is desirable to have an inexpensive circuit which can provide increased resolution for an n-bit A/D converter, thereby alleviating the need to use an A/D converter that is greater than n bits to achieve the desired resolution.

SUMMARY OF THE INVENTION

Accordingly, it is an object of the invention to provide a resolution enhancer (RES) circuit to obtain an increased resolution when used with an A/D converter. The RES circuit includes a prescaling circuit which is configured to receive an analog input signal which is operable over a first range and outputs a prescaled analog signal which is operable over a second range. The RES circuit also includes a sampling circuit which is configured to receive the prescaled analog signal and to sample the prescaled analog signal as a sampled signal upon receipt of a control signal. The RES circuit further includes an amplification circuit configured to receive the sampled signal and the prescaled analog signal, and to amplify a difference between the sampled signal and the prescaled analog signal as an amplified signal. The amplified signal is input to the A/D converter, which determines a number of counts based on the amplified signal. When the number of counts approaches one of a maximum input signal saturation condition and a minimum input signal saturation condition, the count signal is output to enable resampling of the prescaled analog signal.

The system according to the invention also includes a resolution enhancer circuit for use with an A/D converter, which includes prescaling means for receiving an analog input signal which is operable over a first range and for outputting a prescaled analog signal which is operable over a second range. The resolution enhancer circuit further includes sampling means for receiving the prescaled analog signal and a control signal and for sampling the prescaled analog signal as a sampled signal when the control signal is in an active state. The resolution enhancer circuit still further includes an amplification and unity gain follower means for receiving the sampled signal and the prescaled analog signal and for amplifying and outputting a difference between the sampled signal and the prescaled analog signal when the control signal is in an inactive state and for outputting the prescaled analog signal when the control signal is in the active state. By this arrangement, the output of the amplification and unity gain follower means is input to the A/D converter, and the A/D converter determines a digitized number of the output of the amplification and unity gain follower means based on the output of the amplification and unity gain follower means. When the digitized number approaches one of a maximum digitized number and a minimum digitized number of the A/D converter, the control signal is placed into the active state by the A/D converter to enable resampling of the prescaled analog signal.

The system according to the invention includes a method for increasing the resolution of an A/D converter, which includes a step of receiving an analog input voltage to be converted to a digital value. The method also includes a step of prescaling the analog input voltage to a range operable within the A/D converter. The method further includes a step of determining a digital value corresponding to the prescaled analog input voltage by the A/D converter. The method also includes a step of sampling the prescaled analog input voltage when the digital value is either greater than a first value or less than a second value. The method also includes a step of determining a difference between the prescaled analog input voltage and the sampled prescaled analog input voltage. The method even still further includes a step of magnifying the difference between the prescaled analog input voltage and the sampled prescaled analog input voltage by a third amount. The method also includes a step of computing a digital value corresponding to the magnified difference. The method includes a step of resampling the prescaled analog input voltage when the digital value of the magnified difference is either greater than the first value or less than the second value. Lastly, the method includes the step of stitching together the counts between resamples of the prescaled analog input voltage in order to form a contiguous digital signal representative of the analog input signal.

BRIEF DESCRIPTION OF THE DRAWINGS

In describing an apparatus according to the invention, reference is made to the following description and accompanying drawings, in which:

FIG. 4a shows a typical input waveform Vn that varies within a 1 to 5 volt range;

FIG. 4b shows the pre-scaled voltage BSVn based on the input waveform Vn of FIG. 4a;

FIG. 4c shows the amplified waveform Vp;

FIG. 4d shows the sampled waveform CBSVn; and

FIG. 4e shows the control signal Sbias that causes resampling of the waveform BSVn resulting in a new sampled value for CBSVn.

DETAILED DESCRIPTION OF THE PREFERRED EMBODIMENTS

Figure 1:
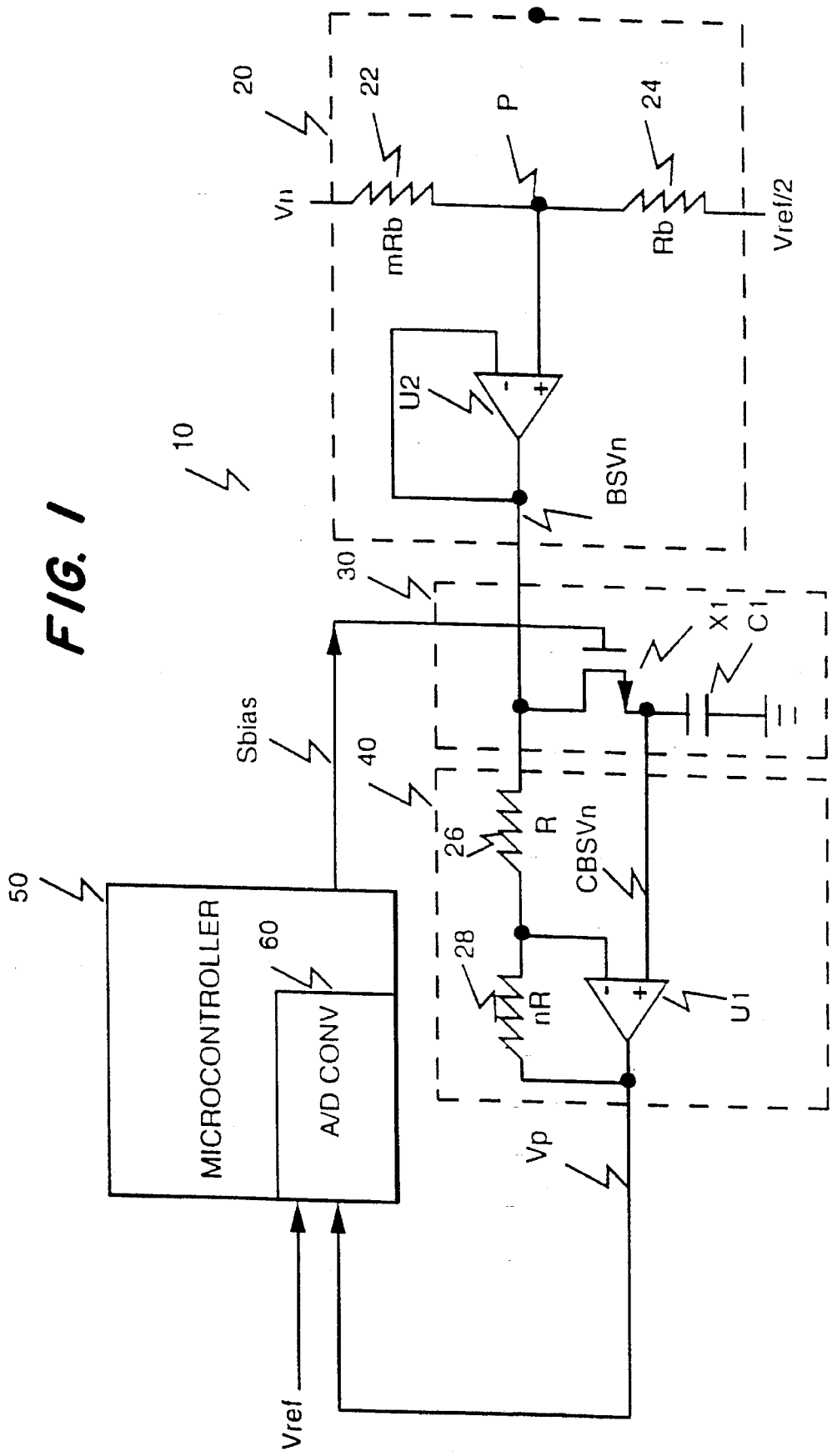
FIG. 1 is a diagram of the RES Circuit used in cooperation with an A/D according to a first embodiment of the invention.

FIG. 1 shows a block diagram of the resolution enhancer (RES) circuit 10 according to a first embodiment of the invention. The RES circuit 10 includes a prescaling circuit 20, a sampling circuit 30, an amplification circuit 40, and a microcontroller 50. The microcontroller 50 includes an A/D converter (A/D) 60, which receives as an input a reference voltage $V_{ref}$. The reference voltage $V_{ref}$ determines the operating input range of the A/D 60.

In the first embodiment, $V_{ref}$ is equal to 3.9 volts. This corresponds to a 0 to 3.9 volt analog input voltage range of the A/D 60. Of course, $V_{ref}$ can be set to any suitable reference voltage value to thereby increase or decrease the operating range of the A/D, at the expense of decreased or increased resolution in the digital output, respectively. For example, if $V_{ref}$ is set to 7.8 volts, then the resolution of the A/D 60 will be halved, since a 7.8 volt input range corresponds to $7.8/2^8 = 0.0305$ volts per A/D count, while a 3.9 volt input range of the A/D corresponds to $3.9/2^8 = 0.0157$ volts per A/D count.

The prescaling circuit 20 includes a first resistor 22 having a resistance mRb ohms and a second resistor 24 having a resistance Rb ohms. The first resistor 22 is connected to receive an analog input voltage Vn on one side, and is connected on its other side to the second resistor 24. The analog input voltage Vn is a voltage which is to be converted to a digital value by the A/D 60. The second resistor 24 is also connected to receive a voltage $V_{ref/2}$ on its other side. The voltage $V_{ref/2}$ corresponds to one-half of the reference voltage $V_{ref}$. The first resistor 22 and the second resistor 24 operate together as a voltage divider circuit. The prescaling circuit 20 also includes an op amp U2, which operates as a unity gain follower circuit. The inverting input of the op amp U2 is connected to the output of the op amp U2. The non-inverting input of the op amp U2 is connected at a point P to the first resistor 22 and to the second resistor 24.

The output BSVn of the op amp U2 is received by the sampling circuit 30. The sampling circuit 30 includes a field effect transistor (FET) X1 and a capacitor C1. The field effect transistor X1 has a gate terminal connected to receive a control signal Sbias from the microcontroller 50. The signal Sbias causes the sampling circuit 30 to sample the signal BSVn in a manner that will be described in more detail herein. The capacitor C1 is connected at one end to the FET X1, and is connected at its other end to a low impedance reference potential (i.e., ground). The sampling circuit 30 samples the value BSVn at times determined by the assertion of the control signal Sbias, and outputs a sampled value CBSVn accordingly at the source of the FET X1.

The amplification circuit 40 receives both the output BSVn from the prescaling circuit 20 and the output CBSVn from the sampling circuit 30. The amplification circuit 40 can operate in either a unity gain follower mode (when Sbias is active, high), or in an inverting gain mode (when Sbias is inactive, low). The amplification circuit 40 includes a third resistor 26 having a resistance R ohms, a fourth resistor 28 having a resistance nR ohms, and an op amp U1. The third resistor 26 is connected between the output of the prescaling circuit 20 and the inverting input of the op amp U1, and the fourth resistor 28 is connected between the inverting input of the op amp U1 and the output of the op amp U1. In the inverting gain mode, the op amp U1 has a gain equal to $-(nR/R) = -n$. The noninverting input of the op amp U1 is connected to receive the sampled value CBSVn from the sampling circuit 30. The output Vp of the op amp U1 is connected to an input port of the A/D 60, which is part of the microcontroller 50. The A/D 60 digitizes the analog input signal Vp, such as by providing a number of A/D counts corresponding to the input signal Vp.

The analog input signal Vn is pre-scaled by the prescaling circuit 20. In the first embodiment, the first resistor 22 is a standard resistor, but it may alternatively be a variable resistor or potentiometer. The resistance value "m" is determined to ensure that the voltage at the non-inverting input of the op amp U2 is within the common mode voltage range of the op amp U1. This prescaling allows the RES circuit 10 to process signals which exceed the common mode range of the op amps U1 and U2, and the voltage range of the A/D 60 in the microcontroller 50. The prescaled input signal BSVn is buffered by the op amp U2. The amount of prescaling is set so that the voltage range of the prescaled output BSVn of the op amp U2 is over the full range of Vn. The amount of prescaling is also set to allow an appropriate amount of headroom for signals input to the A/D 60.

The buffered prescaled signal BSVn is used as a bias voltage for the op amp U1, which is configured as either an inverting amplifier when Sbias is in a low (or inactive) state, or a voltage follower when Sbias is in a high (or active) state. When Sbias is in a high state, the op amp U1 operates in a unity gain follower mode according to the following equation:

$$Vp = BSVn \quad (1)$$

When Sbias is in a low state, the op amp U1 operates in an inverting amplifier mode according to the following equation:

$$Vp = CBSVn - n(BSVn - CBSVn) \quad (2),$$

where $$BSVn = Vn(1/m+1) + (V_{ref}/2)(m/m+1) \quad (3)$$

When the op amp U1 is configured as a unity gain follower, the FET X1 will be in the ON (i.e., conductive) state. In the preferred embodiment, the FET X1 is configured as an n-channel enhancement mode FET. In the preferred embodiments, the FET X1 is a model 2N7000, manufactured by Motorola. This type of transistor can conduct current in either direction. That is, as long as the gate voltage is higher than either the source or drain voltages, the drain and the source will swap roles with the one at the lower voltage becoming the source and the other one becoming the drain.

When the FET X1 is ON, the voltage CBSVn at capacitor C1 is set to the current value of BSVn. The output Vp of the op amp U1 will be set equal to BSVn, since the op amp U1 operates in a unity gain follower mode when the FET X1 is ON. This follower mode of operation is possible because op amp U1 amplifies the difference between the voltages at its inverting and non-inverting terminals, i.e., BSVn and CBSVn. With the FET X1 in an ON state, the difference between BSVn and CBSVn is zero, since CBSVn has been set to the current value of BSVn. This leaves the output Vp of the op amp U1 at the sampled bias voltage CBSVn, as can readily be seen from Equation (2) when BSVn equals CBSVn.

In the inverting mode, the FET X1 is OFF due to Sbias being in the low state. In this case, the difference between BSVn and CBSVn is amplified by the inverting gain of the amplification circuit 40, which corresponds to the value $nR/R = n$, and also is biased to the voltage CBSVn, as can be seen from Equation (2). The op amp U1 is preferably chosen to have a low input bias current. In the preferred embodiments, the op amp U1 and the op amp U2 are a model TLC274, manufactured by Texas Instruments. By this choice of op amp, it is ensured that the voltage at CBSVn is maintained until the FET X1 is turned ON again to reset the bias of the amplification circuit 40. This "holding" of the sampled value CBSVn between assertions of the signal Sbias can be seen from FIGS. 4d and 4e.

In the RES circuit 10, the voltage range of Vn is scaled by the prescaling circuit 20 such that the prescaled output BSVn is centered within the input range of the A/D 60. In this case, the "central" point corresponds to $V_{ref/2}$. Referring now to FIGS. 4a and 4b, since Vn can range from 1 to 5 volts, the mid-scale value of Vn is equal to 3 volts. This 3 volt mid-scale value is prescaled to a BSVn value equal to 1.85 volts by the prescaling circuit 20. Since $V_{ref} = 3.9$ volts in the example given in the figures, 1.85 volts corresponds roughly to one-half of this value, or $V_{ref}$ (=1.95 volts). By this arrangement, the analog input signal Vn is prescaled to a range smaller than the input range of the A/D 60. This smaller prescaled range allows for a certain amount of headroom (i.e., distance from an upper or lower saturation condition) for the signal Vp input to the A/D 60 as the analog input signal Vn varies over time.

The range of the prescaled signal BSVn is allowed a sufficient amount of counts of the A/D 60 before the A/D 60 becomes saturated. For example, if $V_{ref}$ is set at 4 volts, then the center of the input range of the A/D 60 will be at 2 volts. If BSVn has a range of from 1 to 3 volts, then there will be 1 volt of headroom before the A/D 60 saturates low (0 counts) or high (255 counts for an 8-bit A/D). Those of ordinary skill in the art will note that the scaling can be set to either maximize the headroom at the cost of greater attenuation of Vn to set BSVn, and a higher gain (n), or to decrease attenuation of Vn to set BSVn, and decrease the gain with less headroom left at the A/D 60. The more attenuation provided by the pre-scaling circuit 20, then the more amplification is required by the amplification circuit 40, which results in less headroom available.

As discussed above, the prescaling circuit 20 is used to modify the range of the analog input signal Vn to be centered within the range of the A/D 60. There is also a need to condition the analog input signal Vn so that when the charge on the capacitor C1 is reset by the assertion of the Sbias signal, there will be some headroom left in order to process the high gain signal Vp.

Those of ordinary skill in the art will recognize that there may be instances in which the analog input voltage range is very small, in which case the prescaling circuit 20 will actually amplify the analog input signal range before sending the signal to the sampling circuit 30 to be eventually processed by the A/D 60. In other cases, the prescaling circuit 20 will just act as a buffer (i.e., with unity gain) for analog input signal ranges that are approximately the same as the input range of the A/D 60 and are also within the common mode input range of the op amps of the RES circuit 10.

Once the prescaling is set, the gain of the op amp U1 is chosen to select the resolution of the RES circuit 10. The resolution corresponds to the number of counts of the A/D 60 for a 1 volt change in the input signal Vn. This can be done without restricting the maximum gain in the system according to the invention. With conventional systems, the maximum gain of any preconditioning electronic circuit would be limited by the input range of the A/D.

To overcome this obstacle, the RES Circuit 10 is structured such that the op amp U1 is set to a voltage follower mode by setting Sbias to a logic high state to thereby reset CBSVn. With the value CBSVn being reset, the output Vp of the op amp U1 is set to the current value of BSVn. Once this is done and the RES circuit 10 is returned to the inverting mode, any changes in BSVn are amplified by the total system gain which is defined by the following equation:

$$TSG = -n*(1/(m+1)) \qquad (4),$$

where

TSG= total system gain (=dVp/dVn).

The gain "n" operates to magnify the "delta" difference between the signals BSVn and CBSVn. The A/D 60 will produce a count based on this magnified difference biased to the sampled value CBSVn. For an 8-bit A/D, this count can be anywhere from 10 counts to 255 counts. Once the count is obtained, the microcontroller 50 can determine the true digital equivalent of Vn, since it knows the prescaling factor m and the amplification gain n (i.e., these values can be stored in a memory internal to the microcontroller 50). The digitization of the magnified difference between BSVn and CBSVn within the operating range of the A/D 60 provides increased resolution of the analog input signal Vn.

Thus, in the system according to the first embodiment, there is a means for resetting the input Vp of the A/D 60 to the current value of BSVn in order to prevent saturation of the A/D 60. As long as the input to the A/D 60 is sampled at a rate fast enough to prevent saturation of the A/D 60, the RES circuit 10 can be reset to a current value of BSVn, and the input waveform Vn can be constructed by stitching the sampled data together. The appropriate sampling rate of the A/D 60 is set based on the maximum dV/dt of the input signal Vn. This is required in order that a sudden change in Vn does not result in saturation of the A/D 60 before the Sbias signal can be asserted in order to reset the bias to a newer value.

For example, in motor controller systems, a 10 Hz sampling rate may be suitable to ensure that there is no more than a 10 count difference between successive samples of the input signal Vp by the A/D 60.

The control signal Sbias is output from the microcontroller 50 whenever the number of A/D counts approaches saturation, i.e., less than 10 A/D counts or greater than 245 A/D counts if a 10-count buffer before saturation of the A/D 60 occurs is desired. The assertion of the control signal Sbias can be asynchronous with respect to the input sampling rate of the A/D 60.

Figure 2:
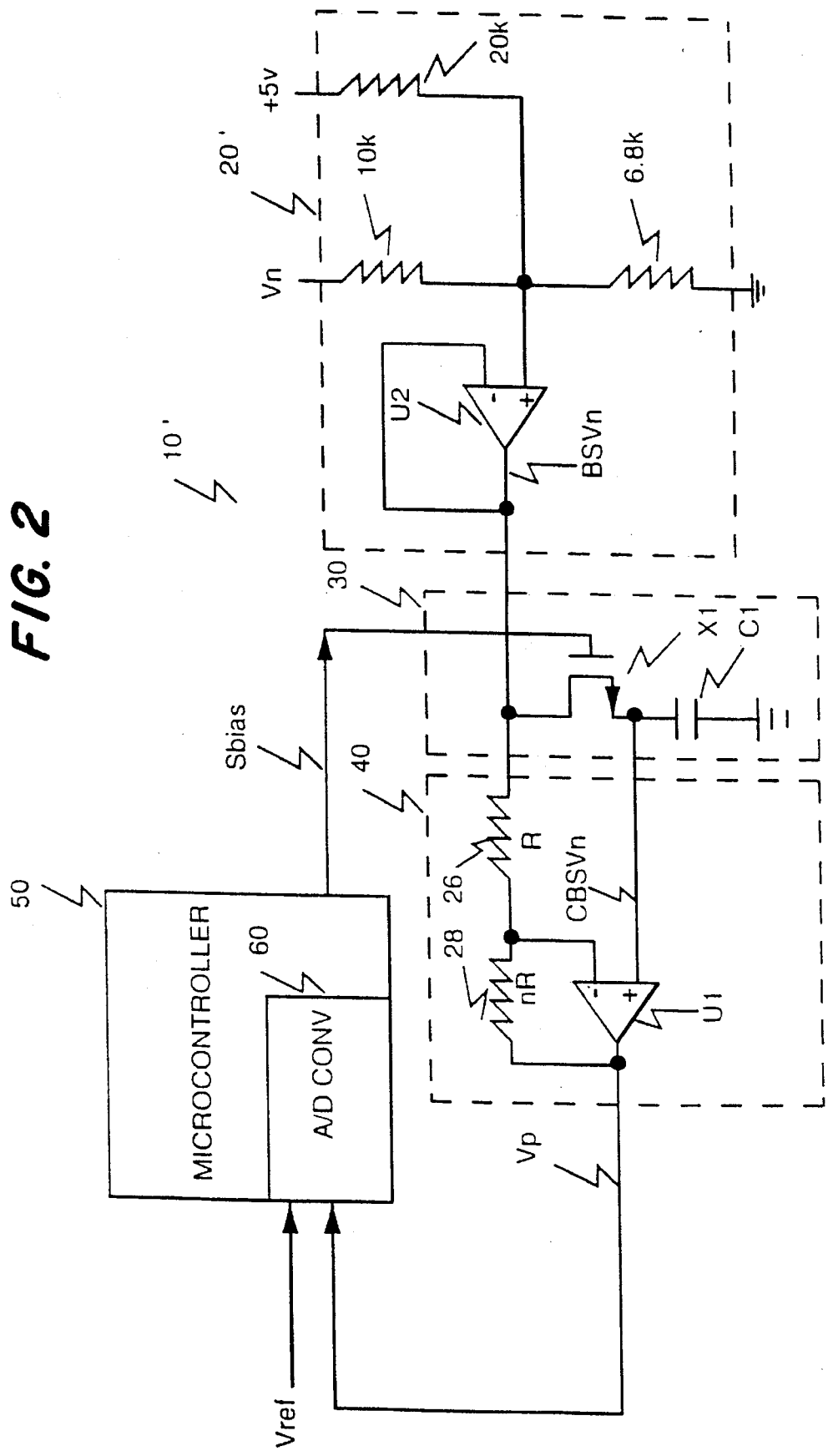
FIG. 2 is a diagram of the RES Circuit used in cooperation with an A/D according to a second embodiment of the invention.

FIG. 2 shows a second embodiment of the RES circuit 10'. In this configuration, the RES circuit 10' is used to amplify a back emf signal (600 mVpp) which is superimposed on a large bias signal operating in a range of from 1.3 to 4.7 volts.

This type of signal is typically used in motor control applications, in order to drive a motor coil. The signal yields a full scale voltage range of from 1 to 5 volts. In this application, the back emf signal is amplified by a total system gain (TSG) of 3. Without the RES circuit 10' according to the second embodiment, an A/D with an input range of from 1 to 12 volts would be required. By using the RES circuit 10', an 8-bit A/D with an input range of from 0 to 3.9 volts is more than adequate.

In the second embodiment of the invention as shown in FIG. 2, the prescaling factor is chosen to be ⅓; i.e., (20 kΩ in parallel with 6.8 kΩ) divided by {(20 kΩ in parallel with 6.8 kΩ)+10 kΩ}. In the second embodiment, the amplification gain is chosen to be 10. The choice of the prescaling factor of the prescaling circuit 20' and the amplification gain of the amplification circuit 40 is a tradeoff between how precise the op amps U1 and U2 are to control offset errors and bias current errors versus increased resolution capability. For the amplification circuit 40, the resistance (R) of the first resistor 26 is set to 4.7 kohms, and the resistance (nR) of the second resistor 28 is set to 47 kohms (i.e., n=10). Of course, other values of resistances R and nR can be used to achieve the appropriate amplification gain while keeping within the scope of the invention. For the sampling circuit 30, the capacitor C1 is set to 0.1 μfarads. Similarly, the capacitor C1 can be set to any small level of capacitance while keeping within the scope of the invention.

The non-inverting input of the op amp U2 is set to 1.85 volts for a 3.0 volt input of Vn (see FIGS. 4a and 4b). The midscale voltage at Vn is 3 volts for this application, which corresponds to the center of the 1.3 to 4.7 volt range. A 3:1 attenuation of Vn performed by the prescaling circuit 20' results in a 200 mVpp back emf signal (i.e., 600 mVpp / 3) biased at 1.85±0.57 volts, or a range of 1.18 to 2.52 volts at the non-inverting input of the op amp U2. This scaling was chosen to allow approximately 1 volt of headroom for the output signal Vp of the op amp U1.

Referring back to FIG. 2, after the prescaling has been performed by the 10 k, 20K and 6.8K ohm resistors of the prescaling circuit 20' the input signal Vn is buffered by the op amp U2, which is configured as a unity gain follower. This provides a prescaled low impedance signal, BSVn, for amplification by the op amp U1. The op amp U1 is configured with an inverting gain of 10 in the second embodiment. The total system gain TSG in the inverting mode is the product of the prescale attenuation factor and the gain of the op amp U1, which equals (⅓) * (10)=3.33. With the bias signal BSVn being captured at the capacitor C1 when the FET X1 is ON, the total system gain TSG is equal to the prescale attenuation factor ⅓, since the op amp U1 is configured as a unity gain follower in this case (i.e., ⅓* 1=⅓ when the amplification gain=1).

By this configuration, once the Sbias signal has been asserted and the high resolution window has been repositioned around the current value of BSVn, there will be at least 1 volt of headroom available for variations in the analog input signal before a saturation condition may occur, which would cause a resampling of the prescaled signal BSVn. This 1 volt of headroom ensures that the Sbias signal is not asserted too often. Since between assertions of the Sbias signal it is a magnified difference of a previously-sampled version CBSVn and a current value BSVn that is being digitally converted by the A/D 60, an appropriate amount of headroom is desirable to ensure that small variations in Vn do not result in too much re-positioning of the high resolution window.

FIGS. 4a through 4e show the waveforms at various points in the RES circuit 10 in order to more clearly illustrate the operation of the RES circuit 10. As the input Vn varies from 5.0 to 1.0 volts (see FIG. 4a), the buffered (pre-scaled) signal BSVn varies from 2.52 to 1.18 volts, respectively (see FIG. 4b). The control signal Sbias is pulsed to set CBSVn equal to the current value of BSVn whenever the A/D 60 approaches saturation (see FIGS. 4b, 4d and 4e), and the capacitor C1 holds the value CBSVn once Sbias is deasserted (see FIG. 4d). Thus, when Sbias is asserted, Vp is set to a value between 1.18 volts and 2.52 volts (see FIG. 4c), which is at least 1 volt away from the respective upper and lower saturation values (3.8 volts and 0.1 volt, respectively) of the A/D 60.

Once Sbias is deasserted, the op amp U1 changes to an inverting mode with a gain of 10. The difference between BSVn and CBSVn is amplified by −10 in the inverting mode. As the signal Vp varies, the microcontroller 50 monitors the number of counts of the A/D 60 to determine if the A/D 60 is approaching saturation; that is, whether the signal is greater than 3.8 volts or less than 0.1 volts. If so, the bias capacitor C1 is reset to charge to a new voltage value CBSVn due to the assertion of the Sbias signal turning on the FET X1. It can be seen from FIGS. 4c, 4d and 4e that at any time Vp approaches the upper or lower saturation limits of the A/D 60, Sbias is asserted. Once Sbias is asserted, CBSVn is reset to the current value of BSVn to move the A/D window to be centered around the current value of BSVn. The high resolution window follows the bias (CBSVn) of the scaled signal BSVn, and it attempts to stay centered on the signal BSVn so as not to saturate the A/D 60.

The voltage Vp can be stitched together in software by incorporating the changes in Vp after a bias change to the current value of Vp. For example, if the starting A/D value of Vp is 100 counts for a value of Vp corresponding to CBSVn (see A of FIG. 4c), and the A/D count decreases to 7 counts (which corresponds to a difference of 100−7=93 counts) after successive A/D samples of Vp (see B of FIG. 4c), the bias will then be reset to the current value of BSVn (by the assertion of the Sbias signal), say 110 counts (see C of FIG. 4c). The A/D counts will continue from that new bias value of 110 counts. Assume now that the A/D count decreases to 8 counts (see D of FIG. 4c) after successive A/D samples of Vp. At this point, the bias will be reset to a new value, say 120 counts (see E of FIG. 4c). Note that the A/D counts at each successive assertion of the Sbias signal has increased from 100 to 110 to 120 counts, due to the increase of the value Vn during this time (see FIG. 4a).

The stitching is performed by adding the 93 counts (100−7) between the first and second assertion of the Sbias signal to the 102 counts (110−8 counts) between the second and third assertion of the Sbias signal, resulting in a stitched waveform of 93+102=195 counts. Note that since the Count=110 value due to the repositioning of the high resolution window corresponds to the Count=7 value that caused the second assertion of the Sbias signal, and so the 102 counts between the second and third assertions of the Sbias signal are 102 counts below the Count=7 value. Thus, the true count value is at 7−102=−95 counts at the time of the third assertion of the Sbias signal. In order to avoid negative counts, a starting count bias can be added to the signal counts, if desired.

FIG. 4c shows the waveform Vp that is used to stitch the digital output together. At each instance when the control signal Sbias is asserted, CBSVn is resampled, and the signal Vp is adjusted to be somewhere near the center of the A/D input range.

The stitching procedure can be utilized to obtain an almost unlimited amount of resolution by selecting higher and higher gains for the RES circuit, which may be very useful for wide input range signals.

Figure 3:
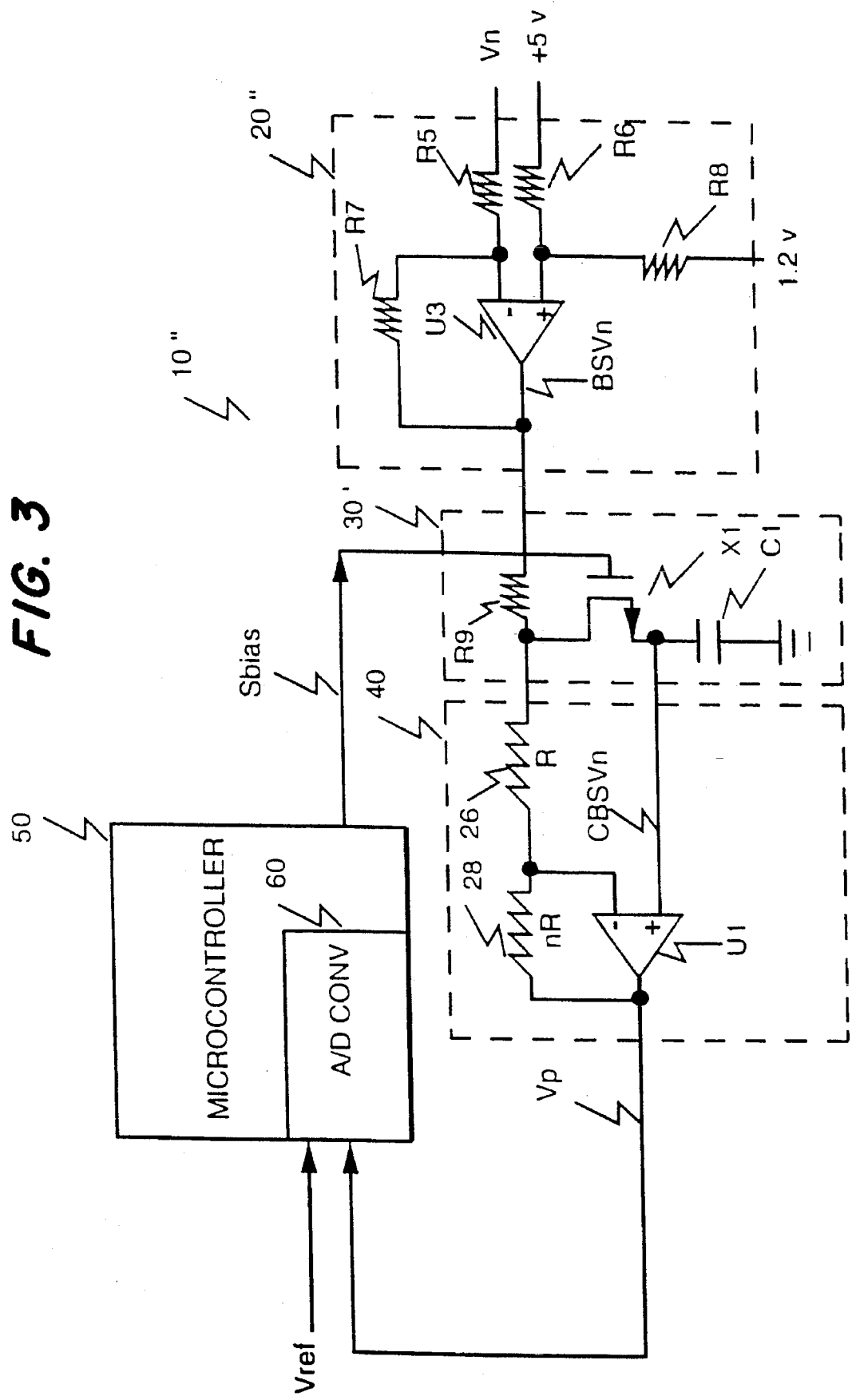
FIG. 3 is a diagram of the RES Circuit used in cooperation with an A/D according to a third embodiment of the invention.

A third embodiment of a RES Circuit 10" is shown in FIG. 3, in which the prescaling circuit 20" uses a differential amplifier U3. The analog input signal Vn is received on the inverting terminal of the differential amplifier U3 via a resistor R5, and a first reference potential (+5 volts) is received on the non-inverting terminal of the differential amplifier U3 via a resistor R6. A resistor R7 is connected between the inverting terminal and the output of the differential amplifier U3, and a resistor R8 is connected between the noninverting terminal and a second reference potential (+1.2 volts).

In the third embodiment, the resistors R5 and R6 have equal resistances, 15 kohms, and the resistors R7 and R8 have equal resistances, 5.1 kohms. Each resistor is preferably is a 1%-accuracy resistor. By this arrangement, a balanced bridge structure is achieved, and any common mode noise generated by the reference potentials and the analog input signal Vn is canceled. The prescaling circuit 20" operates to output the difference between Vn and +5 volts, which is then sent to the sampling circuit 30' and the amplification circuit 40.

The sampling circuit 30' is different from the sampling circuit 30 of the first and second embodiments in that there is shown a resistor R9 situated between the FET X1 and the output of the prescaling circuit 30'. The resistor R9 has a resistance set to 100 ohms, and is used to decouple any capacitive load generated from the prescaling circuit 30'. The resistor R9 is not needed if the FET X1 can effectively decouple the capacitive load by itself, such as is possible with a small geometry FET.

In essence, the RES Circuits 10, 10' 10" of the first through third embodiments of the invention act as a high resolution window following the bias of the input signal The RES Circuits 10, 10', 10" attempt to stay centered on the input signal so that the A/D 60 does not go into saturation. The microcontroller 50 keeps track of the counts of the A/D 60 and the changes in counts of the A/D 60 in order to stitch together the output digital signal.

As explained earlier, in order to avoid negative Vp signal counts, a count bias has to be set. For the RES Circuit 10 as shown in FIG. 1, the count bias would have to be set to 802 counts to avoid negative Vp signal counts. This is calculated as follows:

BiasCounts=256/3.9((BSVnmax−BSVnmin)−10 BSVnmin)

where

Vref=3.9 volts, the A/D is an 8-bit A/D, resulting in $2^8$=256 total counts, and the gain of the amplifier stage is 10. Given the input signal values shown in FIGS. 4a, 4b, and 4c, we get:

BiasCounts=256/3.9 (2.52−1.18) 10−1.18)=802

This calculation assumes the worst case condition of the first sample occurring at the minimum voltage of BSVn (1.18 volts). For this application, the 8-bit A/D that is capable of 256 counts of resolution can process an input signal Vn with an effective signal resolution of 880 counts. The effective resolution of the RES circuit is calculated as:

Sigres=256/3.9(2.52−1.18)10=880

By increasing the inverting gain of op amp U1 by a factor of 2, 1760 counts of resolution can be achieved. That is, by increasing the gain of the op amp U1 by a factor of n, 880*n counts of resolution can be achieved by the RES circuit 10, 10', 10".

By using the RES circuit 10, 10', 10" according to the invention, the input signal Vn is massaged (i.e., prescaled, sampled, and a difference between sampled value and current value is amplified) in a particular way such that increased resolution is obtained. The RES circuit 10, 10', 10" maintains the input signal to within the range of the 8-bit A/D 60, and it uses the microcontroller 50 to monitor the counts of the A/D 60 and to prevent the A/D 60 from going into saturation. The microcontroller 50 controls the bias term that allows the shifting of the resolution window with its smaller range to track the higher range analog input signal. Software internal to the microcontroller 50 can be used to help stitch together the output digital signal.

Thus, if a five-times resolution is obtained using the RES circuit 10, 10', 10" a 0–20 volt signal can be effectively processed by an A/D having a 0–4 volt input range. With this setup, instead of having 256 A/D counts full-scale, one would obtain 256*4=1024 counts full scale, since over the 20 volt range, the output signal can be stitched together using the counts from previously sampled bias signals CBSVn.

While preferred embodiments have been described herein, modifications of the described embodiments may become apparent to those of ordinary skill in the art, following the teachings of the invention, without departing from the scope of the invention as set forth in the appended claims. For example, while the above description was for an 8-bit microcontroller which included an 8-bit A/D, the RES circuit 10, 10', 10" can work equally as well with an n-bit microcontroller with an n-bit A/D. Similarly, other types of devices can be substituted for the FET X1 of the embodiments described above, such as a bipolar junction transistor, a mechanical switch (where Sbias would operate to close or open the switch), a p-type MOS transistor, or other devices which provide an ON/OFF function to set a new voltage to the capacitor C1.

What is claimed is:

1. A resolution enhancer circuit for use with an A/D converter, comprising:

a prescaling circuit configured to receive an analog input signal which is operable over a first range and to output a prescaled analog signal which is operable over a second range;

a sampling circuit configured to receive the prescaled analog signal and a control signal and to sample the prescaled analog signal to provide a sampled signal when said control signal is in an active state;

an amplification and unity gain follower circuit connected to said A/D converter and configured to receive the sampled signal from said sampling circuit and the prescaled analog signal from said prescaling circuit and to output a difference between the sampled signal and the prescaled analog signal when said control signal is in an inactive state and to output said sampled signal when said control signal is in said active state, wherein said A/D converter determines a digitized value of said output of said amplification and unity gain follower circuit, and when the digitized value approaches one of a maximum digitized value and a minimum digitized value of said A/D converter, said control signal is placed into the active state by said A/D converter to enable resampling of said prescaled analog signal by said sampling circuit.

2. A resolution enhancer circuit according to claim 1, wherein said A/D converter determines said digitized value of said output of said amplification and unity gain follower circuit at a predetermined sampling rate, and wherein said control signal is placed into the active state asynchronously with respect to said predetermined sampling rate.

3. A resolution enhancer circuit according to claim 1, wherein said prescaling circuit comprises:

an operational amplifier having an inverting input, a non-inverting input and an output, said inverting input being connected to said output;

a first resistor having a first end connected to receive said analog input signal and having a second end connected to said non-inverting input of said operational amplifier;

a second resistor having a first end connected to receive a first reference voltage and having a second end connected to said non-inverting input of said operational amplifier; and a third resistor having a first end connected to receive a second reference voltage and having a second end connected to said non-inverting input of said operational amplifier.

4. A resolution enhancer circuit according to claim 3, wherein said operational amplifier has a common mode input range that is greater than or equal to the second range.

5. A resolution enhancer circuit according to claim 1, wherein said prescaling circuit comprises:

a differential amplifier having an inverting input, a non-inverting input and an output;

a first resistor having a first end connected to receive said analog input signal and having a second end connected to said inverting input of said differential amplifier;

a second resistor having a first end connected to receive a first reference voltage and having a second end connected to said non-inverting input of said differential amplifier;

a third resistor connected between said inverting input of said differential amplifier and said output of said differential amplifier; and a fourth resistor connected between said non-inverting input of said differential amplifier and a second reference voltage, wherein said second reference voltage is less than said first reference voltage, said first and second resistors have substantially equal resistance values, and said third and fourth resistors have substantially equal resistance values.

6. A resolution enhancer circuit according to claim 1, wherein said A/D converter is configured to receive a first reference voltage defining an analog input voltage range of said A/D converter, and said prescaling circuit comprises:

an operational amplifier having an inverting input, a non-inverting input and an output, said inverting input being connected to said output;

a first resistor having a first end connected to receive said analog input signal and having a second end connected to said non-inverting input of said operational amplifier; and a second resistor having a first end connected to receive a second reference voltage and having a second end connected to said non-inverting input of said operational amplifier, wherein said second reference voltage is less than said first reference voltage, and a resistance of said first resistor divided by a resistance of said second resistor determines an amount of prescaling of said analog input signal.

7. A resolution enhancer circuit according to claim 3, wherein said sampling circuit comprises:

a capacitor connected to a ground potential on a first end and having a second end;

a field effect transistor having a gate terminal connected to receive said control signal, said field effect transistor being in a conductive state when said control signal is in said active state and being in a non-conductive state otherwise, a source of said field effect transistor connected to receive said prescaled analog signal from said output of said operational amplifier, and having a drain connected to said second end of said capacitor, wherein when said field effect transistor is in said conductive state, said capacitor is charged to a current value of said prescaled analog signal and is stored in said capacitor as said sampled signal.

8. A resolution enhancer circuit according to claim 5, wherein said sampling circuit comprises:

a capacitor connected to a ground potential on a first end and having a second end;

a field effect transistor having a gate terminal connected to receive said control signal, said field effect transistor being in a conductive state when said control signal is in said active state and being in a non-conductive state otherwise, a source of said field effect transistor connected to receive said prescaled analog signal from said output of said differential amplifier, and having a drain connected to said second end of said capacitor, wherein when said field effect transistor is in said conductive state, said capacitor is charged to a current value of said prescaled analog signal and is stored in said capacitor as said sampled signal.

9. A resolution enhancer circuit according to claim 6, wherein said sampling circuit comprises:

a capacitor connected to a ground potential on a first end and having a second end;

a field effect transistor having a gate terminal connected to receive said control signal, said field effect transistor being in a conductive state when said control signal is in said active state and being in a non-conductive state otherwise, a source of said field effect transistor connected to receive said prescaled analog signal from said output of said operational amplifier, and having a drain connected to said second end of said capacitor, wherein when said field effect transistor is in said conductive state, said capacitor is charged to a current value of said prescaled analog signal and is stored in said capacitor as said sampled signal.

10. A resolution enhancer circuit according to claim 7, wherein said amplification circuit comprises:

a second operational amplifier having an inverting input, a non-inverting input and an output, said non-inverting input connected to said second end of said capacitor;

a fourth resistor having a first end connected to said output of said second operational amplifier and having a second end connected to said inverting input of said second operational amplifier; and a fifth resistor having a first end connected to said output of said operational amplifier and having a second end connected to said inverting input of said second operational amplifier, wherein second operational amplifier operates as an amplifying circuit defined by a resistance of said fourth resistor divided by a resistance of said fifth resistor when said control signal is in said inactive state, and said second operational amplifier operates as a unity gain follower circuit when said control signal is in said active state.

11. A resolution enhancer circuit according to claim 8, wherein said amplification circuit comprises:

an operational amplifier having an inverting input, a non-inverting input and an output, said non-inverting input connected to said second end of said capacitor;

a fifth resistor having a first end connected to said output of said operational amplifier and having a second end connected to said inverting input of said operational amplifier; and a sixth resistor having a first end connected to said output of said differential amplifier and having a second end connected to said inverting input of said second operational amplifier, wherein operational amplifier operates as an amplifying circuit defined by a resistance of said fifth resistor divided by a resistance of said sixth resistor when said control signal is in said inactive state, and said operational amplifier operates as a unity gain follower circuit when said control signal is in said active state.

12. A resolution enhancer circuit according to claim 9, wherein said amplification circuit comprises:

a second operational amplifier having an inverting input, a non-inverting input and an output, said non-inverting input connected to said second end of said capacitor;

a third resistor having a first end connected to said output of said second operational amplifier and having a second end connected to said inverting input of said second operational amplifier; and a fourth resistor having a first end connected to said output of said operational amplifier and having a second end connected to said inverting input of said second operational amplifier, wherein second operational amplifier operates as an amplifying circuit defined by a resistance of said third resistor divided by a resistance of said fourth resistor when said control signal is in said inactive state, and said second operational amplifier operates as a unity gain follower circuit when said control signal is in said active state.

13. A resolution enhancer circuit for use with an A/D converter, comprising:

prescaling means for receiving an analog input signal which is operable over a first range and for outputting a prescaled analog signal which is operable over a second range;

sampling means for receiving said prescaled analog signal and a control signal and for sampling said prescaled analog signal to provide a sampled signal when said control signal is in an active state;

amplification and unity gain follower means for receiving said sampled signal and the prescaled analog signal and for amplifying and outputting a difference between the sampled signal and the prescaled analog signal when said control signal is in an inactive state and for outputting said prescaled analog signal when said control signal is in said active state, wherein said output of said amplification and unity gain follower means is input to said A/D converter, and said A/D converter determines a digitized number of said output of said amplification and unity gain follower means based on said output of said amplification and unity gain follower means, and when said digitized number approaches one of a maximum digitized number and a minimum digitized number of said A/D converter, said control signal is placed into said active state by said A/D converter to enable resampling of said prescaled analog signal.

14. A method for increasing a resolution of an A/D converter, comprising the steps of:

a) receiving an analog input voltage to be converted to a digital value;

b) prescaling said analog input voltage to a range operable within said A/D converter;

c) determining a digital value corresponding to said prescaled analog input voltage by said A/D converter at a first sampling rate;

d) sampling said prescaled analog input voltage when said digital value is either greater than a first value or less than a second value;

e) determining a difference between said prescaled analog input voltage and said sampled prescaled analog input voltage;

f) magnifying said difference between said prescaled analog input voltage and said sampled prescaled analog input voltage;

g) computing a digital value corresponding to said magnified difference; and h) resampling said prescaled analog input voltage when said digital value of said magnified difference is either greater than said first value or less than said second value.

15. A method for increasing a resolution of an A/D converter according to claim 14, wherein said resampling performed in the step h) is done asynchronously with respect to the first rate of said A/D converter.

16. A method for increasing a resolution of an A/D converter according to claim 14, wherein said difference is magnified in the step f) by a factor greater than one.

17. A method for increasing a resolution of an A/D converter according to claim 14, wherein said first value corresponds to a near-upper saturation condition of said A/D converter, and said second value corresponds to a near-lower saturation condition of said A/D converter.

18. A method for increasing a resolution of an A/D converter according to claim 14, further comprising the step of:

i) creating a digital representation of the analog input voltage by adding a number of A/D counts computed by said A/D converter between successive resampling of said prescaled analog input voltage.

* * * * *